(12) United States Patent
Kuroki

(10) Patent No.: US 7,212,455 B2
(45) Date of Patent: May 1, 2007

(54) DECODER OF SEMICONDUCTOR MEMORY DEVICE

(75) Inventor: Osamu Kuroki, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 52 days.

(21) Appl. No.: 11/218,717

(22) Filed: Sep. 6, 2005

(65) Prior Publication Data

US 2006/0050578 A1 Mar. 9, 2006

(30) Foreign Application Priority Data

Sep. 7, 2004 (JP) ............................. 2004-259528

(51) Int. Cl.
*G11C 29/00* (2006.01)
*G11C 7/00* (2006.01)

(52) U.S. Cl. ...................................... 365/200; 365/201

(58) Field of Classification Search ................ 365/200, 365/201, 230.03
See application file for complete search history.

(56) References Cited

U.S. PATENT DOCUMENTS 5,469,401 A * 11/1995 Gillingham ............ 365/230.06
5,828,624 A * 10/1998 Baker et al. ............ 365/230.06
6,154,416 A * 11/2000 Lee et al. .................... 365/233
6,320,799 B1 * 11/2001 Miyazaki et al. ............. 365/200
2001/0015932 A1   8/2001 Akaogi et al.

FOREIGN PATENT DOCUMENTS

JP    06-203590    7/1994

* cited by examiner

*Primary Examiner*—Anh Phung
(74) *Attorney, Agent, or Firm*—Nixon Peabody LLP; Donald R. Studebaker

(57) ABSTRACT

A column decoder in a semiconductor memory device in which address setting cannot be performed but only a serial access can be performed. The column decoder is constructed by: a redundant fuse for generating a redundant fuse signal; a column decoding circuit for decoding a column address; a column decoding switching circuit for switching an output destination of a decoding result of the column decoding circuit by the redundant fuse signal; and a column driver for driving an output signal of the column decoding switching circuit and generating it to normal column lines and a redundant column line. The column decoding circuit continuously makes the redundant column line operative after the operation of the normal column lines.

4 Claims, 8 Drawing Sheets

FIG. 7
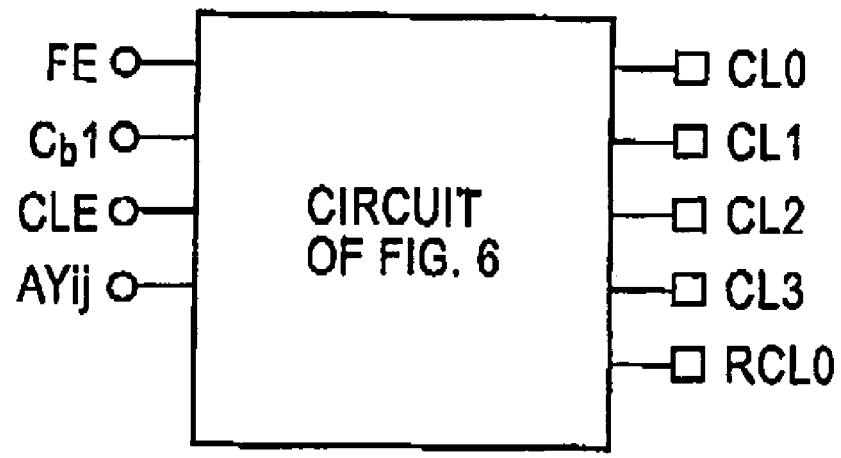
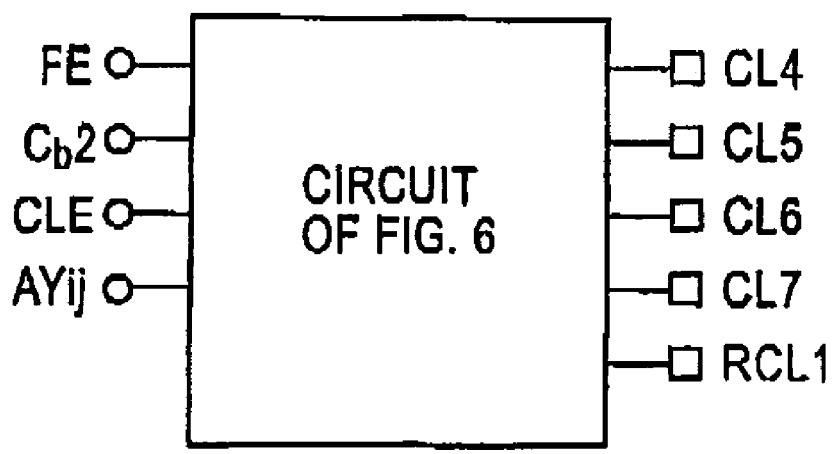
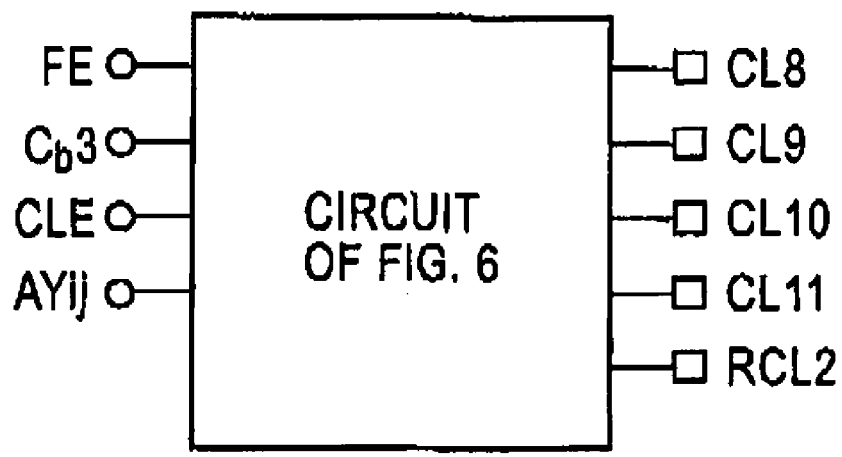

DECODER OF SEMICONDUCTOR MEMORY DEVICE

BACKGROUND OF THE INVENTION

1. Field of the Invention

The invention relates to a decoder in a semiconductor memory device such as FIFO (First-In First-Out) memory or serial register in which addresses cannot be accessed at random and only a serial access can be executed and memory cells of a dynamic type are used and, more particularly, to a testing circuit of redundant memory cells.

2. Description of Related Art

Hitherto, as a redundancy circuit to rescue a defective memory cell in a semiconductor memory device, for example, a redundancy circuit is disclosed in Japanese Patent Kokai No. 6-203590 (patent document 1).

In the patent document 1, in a nonvolatile semiconductor memory device of an electrically batch erasing type such as random access flash memory (for example, EPROM which can be erased by ultraviolet rays and is electrically writable), a technique regarding a word line redundancy circuit on the row side has been disclosed.

In a semiconductor memory device using a dynamic type memory cell using a storing function by storage of charges due to a capacitance of a gate of an MOS transistor and a high input resistance, methods of rescuing a defective memory cell by preparing a redundant memory cell have widely been put into practical use. Particularly, as one of the methods of rescuing the defective memory cell in the column direction, what is called a shift type redundancy circuit in which memory cells after the defective memory cell are sequentially shifted is used. An example of a construction of a semiconductor memory device having the shift type redundancy circuit is shown in FIG. 1.

FIG. 1 is a constructional diagram showing an outline of the conventional semiconductor memory device.

The semiconductor memory device has the shift type redundancy circuit, is a memory such as an FIFO memory in which an address cannot be set and only a serial access can be performed, and has a memory cell array 1 for storing data. The memory cell array 1 has: a plurality of word lines WL of the row direction; a plurality of pairs of bit lines BL and opposite-phase bit lines BLb which perpendicularly cross the plurality of word lines WL; and a plurality of pairs of transfer data lines DL and opposite-phase transfer data lines DLb which are arranged in parallel with the pairs of bit lines BL and BLb and electrically connected. Dynamic type memory cells 2 are connected to crossing points of each word line WL and the bit lines BL and BLb, respectively, and arranged in a matrix shape. Each of the dynamic type memory cells 2 is a memory cell of one-transistor type constructed by: a capacitor 2a for accumulating charges connected to a power line; and an n-channel type MOS transistor (hereinafter, abbreviated to "NMOS") 2b for transferring the charges connected between the capacitor 2a and the bit line BL or BLb. A gate of the NMOS 2b is connected to the word line WL and its drain is connected to the bit line BL or BLb.

A plurality of word lines WL are connected to a row decoder section 3 for decoding row addresses and selectively activated by outputs of the row decoder section 3. A sense amplifying section 4-1 is connected to one end side of the plurality of pairs of bit lines BL and BLb and a sense amplifying section 4-2 is also connected to the other end side of the pairs of bit lines BL and BLb. The sense amplifying section 4-1 has a plurality of sense amplifiers 5A connected between the bit lines BL and BLb. Similarly, the sense amplifying section 4-2 has a plurality of sense amplifiers 5B connected between the bit lines BL and BLb. Each of the sense amplifiers 5A and 5B is a circuit for amplifying an electric potential difference between the bit lines BL and BLb upon reading the data.

A read register section 6-1 is connected to one end side of the plurality of pairs of transfer data lines DL and DLb connected to the pairs of bit lines BL and BLb. A write register section 6-2 is connected to the other end side of the pairs of transfer data lines DL and DLb. The read register section 6-1 has a plurality of read registers 7A connected between the transfer data lines DL and DLb. Each read register 7A is a circuit for receiving read data read out from the pair of bit lines BL and BLb through the pair of transfer data lines DL and DLb and temporarily holding it. Each write register 7B is a circuit for temporarily holding write data into the memory cell 2 and sending the holding write data to the bit lines BL and BLb through the transfer data lines DL and DLb.

A pair of read data lines RDL are connected to one end side of each pair of transfer data lines DL and DLb through each pair of NMOSs 8A-1 and 8A-2 for transferring the data. A common gate of each pair of NMOSs 8A-1 and 8A-2 is connected to a column decoder section 9-1 for reading through a column line CL. The column decoder section 9-1 decodes a column address for reading, controls ON/OFF of the plurality of pairs of NMOSs 8A-1 and 8A-2, and connects one end side of the pair of transfer data lines DL and DLb and the read data lines RDL. The column decoder section 9-1 is constructed by a plurality of decoders 10A. A pair of write data lines WDL are connected to the other end side of each pair of transfer data lines DL and DLb through each pair of NMOSs 8B-1 and 8B-2 for transferring the data. A common gate of each pair of NMOSs 8B-1 and 8B-2 is connected to a column decoder section 9-2 for writing through the column line CL. The column decoder section 9-2 decodes a column address for writing, controls ON/OFF of the plurality of pairs of NMOSs 8B-1 and 8B-2, and connects the other end side of the pair of transfer data lines DL and DLb and the write data lines WDL. The column decoder section 9-2 is constructed by a plurality of decoders 10B. Each of the decoders 10A and 10B is constructed by the same circuit although their column addresses which are inputted are different.

In the memory cell array 1 shown in FIG. 1, for example, a plurality of groups of memory cell 2 connected to the plurality of bit lines BL and BLb in the upper portion construct a normal cell section (ordinary cell section) 11 and a plurality of groups of memory cell 2s connected to the bit lines BL and BLb in the lowest portion construct a redundant cell section 12. As for the redundant cell section 12, to rescue the defective memory cell 2 in the normal cell section 11, when the defective memory cell 2 becomes a target for reading or writing (accessing) the data, the redundant cell section 12, the redundant memory cell 2s is accessed in place of the defective memory cell 2.

In the semiconductor memory device in FIG. 1, when data DA is written into the memory cell 2 connected to a certain word line WL and a certain bit line BL, the supplied row address AX and column address AY are decoded by the row decoder section 3 and the column decoder section 9-2 for writing. The word line WL is activated to the "H" level and, at the same time, the NMOSs 8B-1 and 8B-2 in the column address AY are turned on. The write data DA inputted to the write data lines WDL is transferred to the transfer data lines DL and DLb connected thereto through the NMOSs 8B-1 and 8B-2 in the ON state and held in the register 7B connected thereto. The data DA held in the register 7B is sent through the transfer data lines DL and DLb to the bit lines BL and BLb connected thereto and stored into the capacitor 2a through the NMOS 2b in the memory cell 2 in the ON state by the word line WL at the "H" level.

For example, if there previously is a defect in the memory cell 2 and the defective memory cell 2 has been replaced by the redundant memory cell 2s, when the row address AX and the column address AY are supplied, they are decoded by the row decoder section 3 and the column decoder section 9-2 for writing, the redundant memory cell 2s is selected in place of the defective memory cell 2, and the data DA is written into the redundant memory cell 2s.

In the case of reading out the data DA stored in the memory cell 2, the supplied row address AX is decoded by the row decoder section 3, the word line WL is activated to the "H" level, and each NMOS 2b in the plurality of memory cells 2 connected thereto are turned on. When each NMOS 2b in the plurality of memory cells 2 is turned on, the data DA stored in each capacitor 2a is read out to each pair of bit lines BL and BLb, amplified by each sense amplifier 5A connected thereto, and thereafter, held in each register 7A. The supplied column address AY for reading is decoded by the column decoder section 9-1 for reading and only the NMOSs 8A-1 and 8A-2 in the column address AY are turned on. The data held in the register 7A is read out to the read data lines RDLs through the transfer data lines DL and DLb and the NMOSs 8A-1 and 8A-2 in the ON state.

For example, if there previously is a defect in the memory cell 2 and the defective memory cell 2 has been replaced by the redundant memory cell 2s, the data DA which is stored in the defective memory cell 2 is stored in the redundant memory cell 2s in place of the defective memory cell 2. When the row address AX and the column address AY are supplied in order to read out the data, therefore, they are decoded by the row decoder section 3 and the column decoder section 9-1 for reading, the redundant memory cell 2s is selected in place of the defective memory cell 2, and the data DA is read out from the redundant memory cell 2s.

In this type of semiconductor memory device, as a method of improving a rescue ratio of the defective memory cell 2, a redundant cell test to discriminate whether or not the defective memory cell 2s exists among a plurality of redundant memory cell 2s is often executed at the time of a probing test upon manufacturing. If the defective memory cell 2s exists among the redundant memory cells 2s, a program is made so as not to use the defective memory cell 2s.

To execute the redundant cell test, the operating mode is set into a mode in which the redundant memory cell 2s is certainly selected by a test terminal (not shown) or the like and its address is designated, so that the presence or absence of a defect of the redundant memory cell 2s can be discriminated.

SUMMARY OF THE INVENTION

In the semiconductor memory device as shown in FIG. 1 such as conventional FIFO memory or serial register in which the address setting cannot be performed and only the serial access can be executed, however, although the writing/ reading operation can be serially executed from the head address in a memory space by a reset input in terms of a circuit construction, such an operation that the writing/ reading is executed from an arbitrary address like a general DRAM (Dynamic Random Access Memory) or the like cannot be executed. To execute a redundant cell test in the column direction, therefore, since only the address of the redundant memory cell 2s cannot be designated, it is necessary to access the whole memory space after the apparatus is set into a redundant cell test mode. Since the whole memory space is, thus, accessed only for discrimination about the defect of the redundant memory cell 2s, there is a problem of an increase in testing time.

A decoder of a semiconductor memory device of the invention comprises a redundant fuse for generating a redundant fuse signal in which a redundant position has been programmed, a column decoding circuit having a decoding portion and an output portion, a column decoding switching circuit having first and second transfer portions, and a column driver having first and second driving devices.

A redundant address signal which is set to a first electric potential upon selection of a normal column line and shifted to a second electric potential upon selection of a redundant column line which is continuously selected after the end of the selection of the normal column line is supplied to the decoding portion in the column decoding circuit, and the decoding portion is activated by the first electric potential, decodes a column address, generates a normal column line selection signal, after that, is inactivated by the second electric potential, and stops the generation of the normal column line selection signal. The output portion continuously generates a redundant column line selection signal after the generation of the normal column line selection signal in response to the second electric potential of the redundant address signal.

A transfer destination of the first transfer portion in the column decoding switching circuit is switched by the redundant fuse signal and the first transfer portion generates the normal column line selection signal to the switched transfer destination. The second transfer portion controls passage or shut-off of the redundant column line selection signal in response to the redundant cell test signal. The first driving device in the column driver is activated by a column enable signal, drives the normal column line selection signal generated from the first transfer portion, and transmits the driven normal column line selection signal to the normal column line. The second driving device is activated by the column enable signal, continuously drives the redundant column line selection signal generated from the second transfer portion after the generation of the signal from the first driving device, and generates the driven redundant column line selection signal to the redundant column line.

A decoder of another semiconductor memory device of the invention comprises: a redundant fuse for generating a redundant fuse signal in which a redundant position has been programmed; a column decoding circuit having first and second decoding portions; a column decoding switching circuit having first and second transfer portions; and a column driver having first and second driving devices.

A redundant cell test signal which is set to a first electric potential upon selection of a normal column line and shifted to a second electric potential upon selection of a redundant column line is supplied to the first decoding portion in the column decoding circuit, and the first decoding portion is activated by the first electric potential, decodes a column address, generates a first normal column line selection signal, is inactivated by the second electric potential, and stops the generation of the first normal column line selection signal. The second decoding portion decodes the column address, is activated by the first electric potential of the redundant cell test signal on the basis of a decoding result, generates a second normal column line selection signal, is inactivated by the second electric potential of the redundant cell test signal, and generates a redundant column line selection signal.

A transfer destination of the first transfer portion in the column decoding switching circuit is switched by the redundant fuse signal and the first transfer portion generates the first normal column line selection signal to the switched transfer destination. A transfer destination of the second transfer portion is switched by the redundant fuse signal and the second transfer portion generates the second normal column line selection signal generated from the second decoding portion or the redundant column line selection signal to the switched transfer destination. The first driving device in the column driver is activated by a column enable signal, drives the first and second normal column line selection signals generated from the first and second transfer portions, and generates the driven first and second normal column line selection signals to the normal column line. The second driving device is activated by the column enable signal, drives the redundant column line selection signal generated from the second transfer portion and generates the driven redundant column line selection signal to the redundant column line.

In the decoder, for example, the decoding portion and the driving device are constructed by logic circuits and the transfer portion is constructed by a transfer gate.

According to the decoder of the semiconductor memory device of the invention, at the time of a defect test of a normal (ordinary) memory cell, the redundant memory cells can be continuously accessed after the access to the normal memory cell. Since there is, consequently, no need to separately execute the redundant cell test and to access the unnecessary memory cells, the testing time can be shortened.

According to the decoder of another semiconductor memory device of the invention, only the redundant memory cells can be sequentially accessed irrespective of the status of the column address. Since there is, consequently, no need to access the unnecessary memory cells at the time of the redundant cell test, the testing time can be shortened.

BRIEF DESCRIPTION OF THE DRAWINGS

FIG. 7 is a constructional diagram showing the whole circuit of FIG. 6.

DETAILED DESCRIPTION OF THE PREFERRED EMBODIMENTS

According to the invention, a redundant fuse signal in which a redundant position has been programmed is generated from a redundant fuse and sent to column decoding switching circuit. A redundant address signal which is set to a first electric potential upon selection of a normal column line and shifted to a second electric potential upon selection of a redundant column line which is continuously selected after the end of the selection of the normal column line is supplied to a decoding portion in a column decoding circuit. The decoding portion is activated by the first electric potential, decodes a column address, generates a normal column line selection signal to the column decoding switching circuit, after that, is inactivated by the second electric potential, and stops the generation of the normal column line selection signal. The output portion in the column decoding circuit continuously generates a redundant column line selection signal to the column decoding switching circuit after the generation of the normal column line selection signal in response to the second electric potential of the redundant address signal.

A transfer destination of the first transfer portion in the column decoding switching circuit is switched by the redundant fuse signal and a first transfer portion generates the normal column line selection signal to the switched transfer destination. A second transfer portion controls passage or shut-off of the redundant column line selection signal in response to the redundant cell test signal. A first driving device in a column driver is activated by a column enable signal, drives the normal column line selection signal supplied from the first transfer portion, and transmits the driven normal column line selection signal to the normal column line. Further, a second driving device is activated by the column enable signal, continuously drives the redundant column line selection signal supplied from the second transfer portion after the generation of the first driving device, and generates the driven redundant column line selection signal to the redundant column line.

Figure 1:
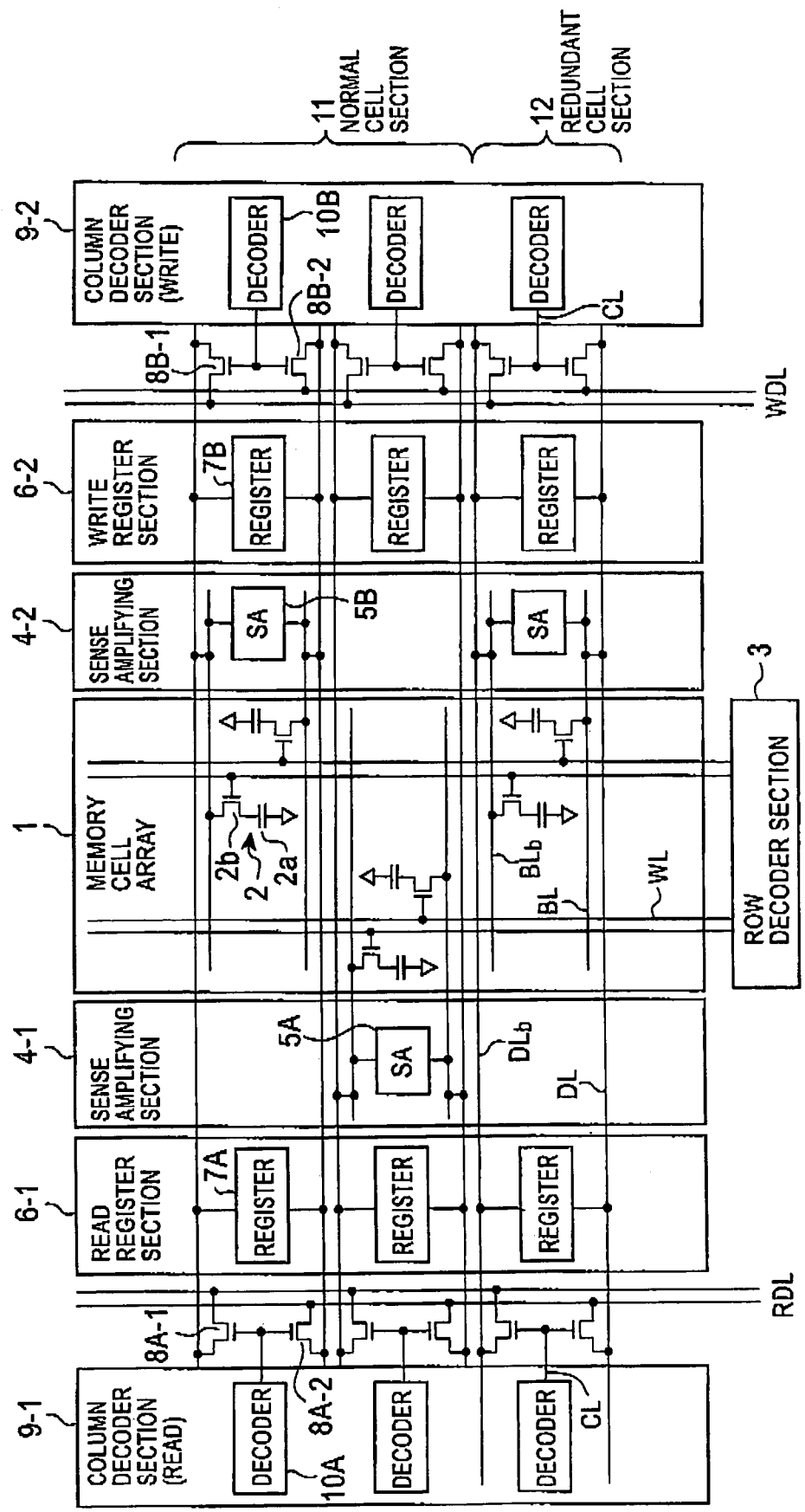
FIG. 1 is a constructional diagram showing an outline of a conventional semiconductor memory device.
Figure 2:
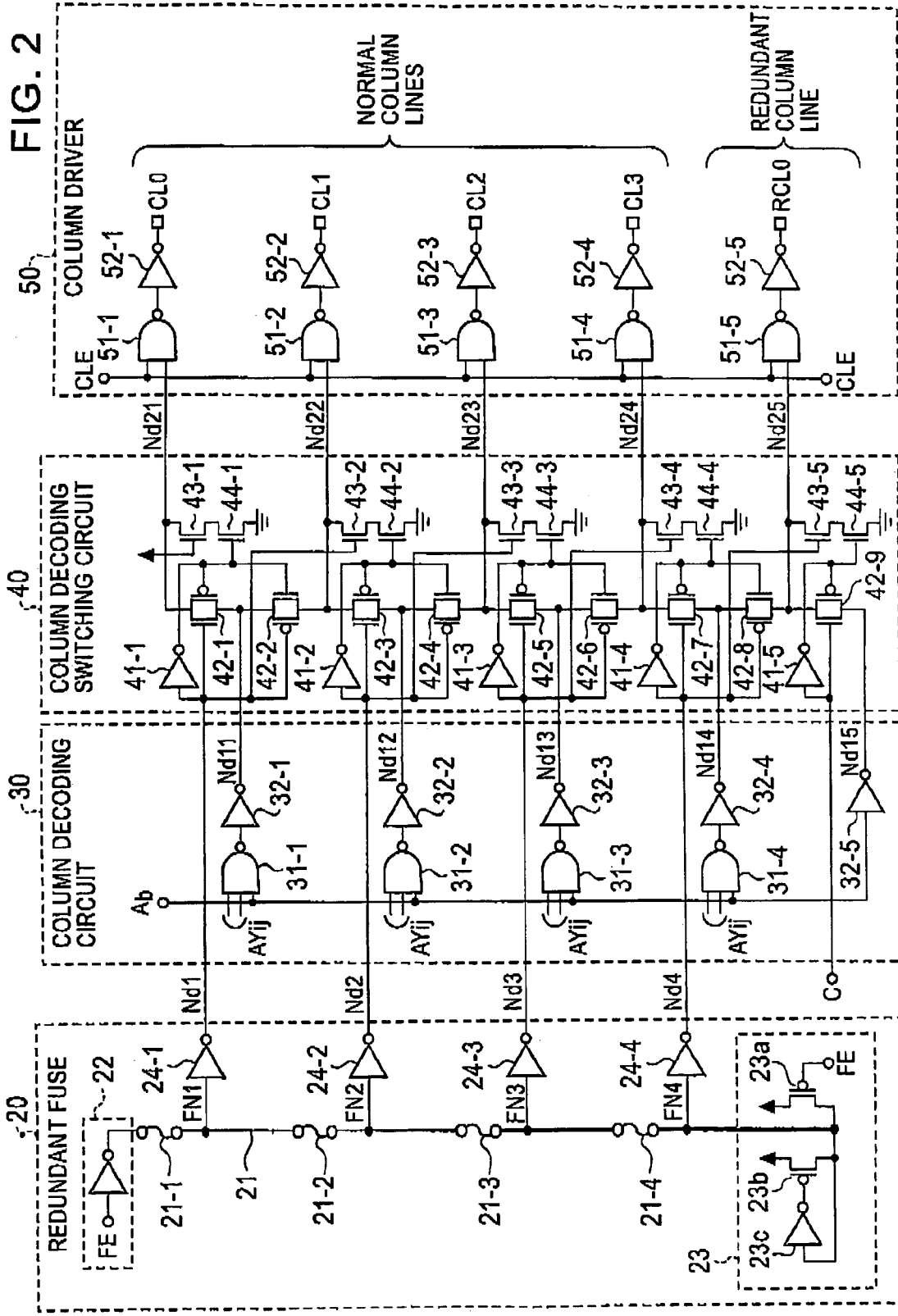
FIG. 2 is a schematic circuit diagram of a decoder in a column decoder in a semiconductor memory device showing an embodiment 1 of the invention.

FIG. 2 is a schematic circuit diagram of a decoder in a column decoder in a semiconductor memory device of FIG. 1 showing an embodiment 1 of the invention.

The decoder in FIG. 2 is a circuit corresponding to each of the decoders 10A and 10B constructing the column decoder sections 9-1 and 9-2 in FIG. 1. In FIG. 2, for simplicity of drawings, a constructional example having four normal column lines CL0 to CL3 and one redundant column line RCL0 is shown.

The decoder in FIG. 2 is mainly constructed by: a redundant fuse 20 for generating a redundant fuse signal; a column decoding circuit 30 for decoding a column address $AY_{ij}$; a column decoding switching circuit 40 for switching an output destination of a decoding result of the column decoding circuit 30 by the redundant fuse signal; and a column driver 50 for driving an output signal of the column decoding switching circuit 40 and supplying the driven output signal to the normal column lines CL0 to CL3 and the redundant column line RCL0.

The redundant fuse 20 is mainly constructed by: a fuse wiring 21 on which disconnectable fuses 21-1 to 21-4 are connected in series; a fuse driver 22, connected to one end of the fuse wiring 21, for transmitting the signal to the fuse wiring 21; a fuse clamp 23, connected to the other end of the fuse wiring 21, for holding an electric potential of the fuse wiring 21; and inverters 24-1 to 24-4.

The inverter 24-1 uses a fuse node FN1 between the fuses 21-1 and 21-2 as an input and uses a node Nd1 as an output. The inverter 24-2 uses a fuse node FN2 between the fuses 21-2 and 21-3 as an input and uses a node Nd2 as an output. The inverter 24-3 uses a fuse node FN3 between the fuses 21-3 and 21-4 as an input and uses a node Nd3 as an output. The inverter 24-4 uses a fuse node FN4 between the fuse 21-4 and the fuse clamp 23 as an input and uses a node Nd4 as an output. The output nodes Nd1 to Nd4 of the inverters 24-1 to 24-4 become outputs of the redundant fuse 20 and are supplied to the column decoding switching circuit 40.

The fuse clamp 23 is mainly constructed by: p-channel type MOS transistors (hereinbelow, abbreviated to "PMOSs") 23a and 23b connected to a power line; and an inverter 23c. A latch circuit is constructed by the PMOS 23b and the inverter 23c. When a fuse enable signal FE is at the "L" level, the PMOS 23a is turned on. When the enable signal FE is at the "H" level, the PMOS 23b is turned on through the inverter 23c, thereby holding the fuse wiring 21 at the "H" level. The PMOS 23b uses such dimensions that its ON-resistance is sufficiently larger than a resistance value of the fuse wiring 21.

The column decoding circuit 30 is mainly constructed by: a decoding portion (for example, 3-input NAND gates (hereinafter, abbreviated to "NANDs") 31-1 to 31-4 and inverters 32-1 to 32-4 for inverting output signals of the NANDs) which is activated by an opposite-phase redundant address signal Ab, decodes the column address $AY_{ij}$, and generates a normal column line selection signal; and an output portion (for example, inverter 32-5) for inverting the opposite-phase redundant address signal Ab and supplying a redundant column line selection signal to a node Nd15. The inverters 32-1 to 32-4 use outputs of the NANDs 31-1 to 31-4 as inputs and use nodes Nd11 to Nd14, as outputs, which are transferred to the column decoding switching circuit 40.

The column decoding switching circuit 40 is mainly constructed by: inverters 41-1 to 41-4 which use the output nodes Nd1 to Nd4 of the redundant fuse 20 as inputs; an inverter 41-5 for inverting a redundant cell test signal C; transfer gates 42-1 to 42-9 each comprising an NMOS and a PMOS; and NMOSs (43-1 and 44-1), (43-2 and 44-2), (43-3 and 44-3), (43-4 and 44-4), and (43-5 and 44-5) which are connected in series every two stages, respectively. The transfer gates 42-1 to 42-9 are circuits for switching the connection of the output nodes Nd11 to Nd15 of the column decoding circuit 30 and nodes Nd21 to Nd25 as outputs of the column decoding switching circuit 40 by the output nodes Nd1 to Nd4 and the redundant cell test signal C and output nodes of the inverters 41-1 to 41-5. The NMOSs (43-1 and 44-1) to (43-5 and 44-5) which are connected in series every two stages are connected between the output nodes Nd21 to Nd25 and the ground line, respectively. The first transfer portion is constructed by: the inverters 41-1 to 41-4; transfer gates 42-1 to 42-8; and the NMOSs (43-1 and 44-1) to (43-4 and 44-4). The second transfer portion is constructed by: the inverter 41-5; transfer gate 42-9; and the NMOSs 43-5 and 44-5.

If the output node Nd1 of the redundant fuse 20 is at the "H" level, the transfer gate 42-1 is turned on, so that the selection decoding output node Nd11 of the inverter 32-1 in the column decoding circuit 30 is transmitted to the node Nd21 through the transfer gate 42-1. If the node Nd1 is at the "L" level, the transfer gate 41-2 is turned on, so that the node Nd11 is transmitted to the node Nd22 through the transfer gate 41-2. In a manner similar to the above, among the output nodes Nd12 to Nd15 of the inverters 32-2 to 32-5, the node Nd12 is transmitted to the node Nd22 or Nd23, the node Nd13 is transmitted to the node Nd23 or Nd24, the node Nd14 is transmitted to the node Nd24 or Nd25, the node Nd15 is transmitted to the node Nd25 in accordance with the statuses of the nodes Nd2 to Nd4 and the redundant cell test mode signal C. The nodes Nd21 to Nd25 become outputs of the column decoding switching circuit 40 and supplied to the column driver 50.

The column driver 50 is mainly constructed by: 2-input NANDs 51-1 to 51-5 whose gates are opened by a column enable signal CLE to decide output timing of the normal column lines CL0 to CL3 and the redundant column line RCL0 and which allow the output signal of the column decoding circuit 30 transferred by the column decoding switching circuit 40 to pass; and inverters 52-1 to 52-5 for driving the normal column lines CL0 to CL3 and the redundant column line RCL0. The first driving device is constructed by the NANDs 51-1 to 51-4 and the inverters 52-1 to 52-4. The second driving device is constructed by the NAND 51-5 and the inverter 52-5.

When the output node Nd21 of the column decoding switching circuit 40 is at the "H" level, the normal column line CL0 is driven through the NAND 51-5 and the inverter 52-1 synchronously with the interval when the column enable signal CLE is set to the "H" level. In a manner similar to the above, when the node Nd22 is at the "H" level, the normal column line CL1 is driven. When the node Nd23 is at the "H" level, the normal column line CL2 is driven. When the node Nd24 is at the "H" level, the normal column line CL3 is driven. When the node Nd25 is at the "H" level, the redundant column line RCL0 is driven.

To clarify features of the embodiment 1, the construction and the operation of the circuit proposed before will now be described.

(The Construction and the Operation of the Circuit Proposed Before)

In the circuit proposed before, for example, in FIG. 2, the 3-input NANDs 31-1 to 31-4 in the column decoding circuit 30 are 2-input NANDs (designated by reference numerals 31-1P to 31-4P for convenience of explanation) to which the redundant address signal Ab is not supplied but only the column address $AY_{ij}$ is supplied. The inverter 32-5 which receives the redundant address signal Ab and the inverter 41-5 and transfer gate 42-9 which receive the redundant cell test mode signal C are not provided. A gate of the NMOS 44-5 is connected to a power line.

In the circuit proposed before, the following testing operations (1) and (2) are executed.

Figure 3:
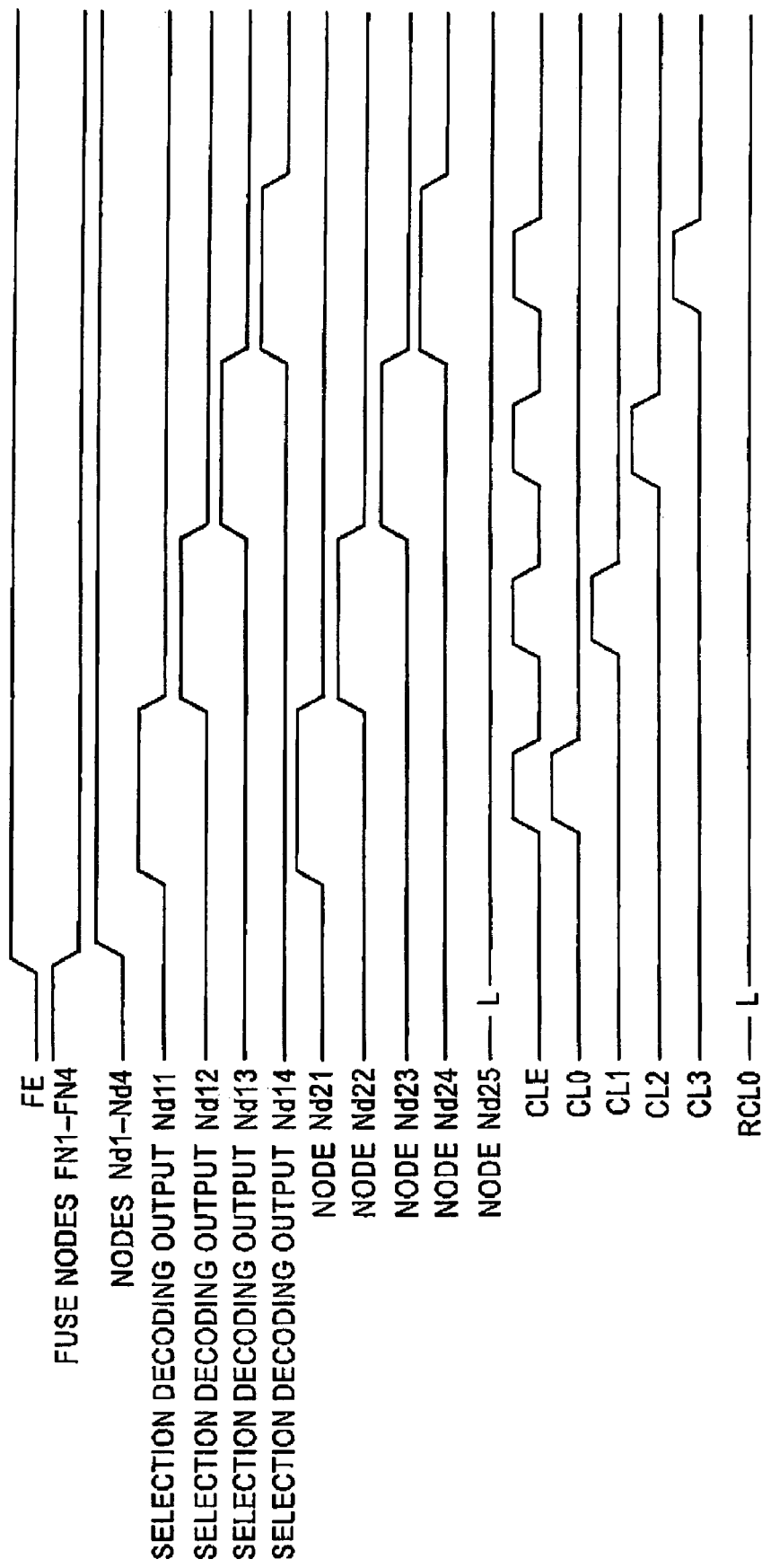
FIG. 3 is a timing waveform diagram showing the operation when a redundancy circuit in the circuit proposed before is not used.

(1) The Operation when the Redundancy Circuit in the Circuit Proposed Before is Not Used: FIG. 3

FIG. 3 is a timing waveform diagram showing the operation when the redundancy circuit in the circuit proposed before is not used.

When executing the tests of all memory cells other than the redundant memory cell (the case where the redundant column line RCL0 is not used) the operation is as follows.

The fuse enable signal FE is changed from the "L" level to the "H" level, and the fuse nodes FN1 to FN4 on the fuse wiring 21 are changed from the "H" level to the "L." level. This level is inverted by the inverters 24-1 to 24-4, and the output nodes Nd1 to Nd4 are set to the "H" level. The output sides of the inverters 41-1 to 41-4 in the column decoding switching circuit 40 are, thus, set to the "L" level. The transfer gates 42-1, 42-3, 42-5, and 42-7 among the transfer gates 42-1 to 42-8 are turned on. Assuming that after the transfer gates 42-1, 42-3, 42-5, and 42-7 are turned on, for example, the column address $AY_{ij}$ is decoded by the 2-input NANDs 31-1P to 31-4P in the column decoding circuit 30 and inverted by the inverters 32-1 to 32-4 and the output node Nd11 among the output nodes Nd11 to Nd14 is selected and set to the "H" level, the node Nd11 passes through the transfer gate 42-1, and the node Nd21 is set to the "H" level. Subsequently, an output signal of the NAND 51-1 is changed from the "H" level to the "L" level synchronously with the period of time during which the column enable signal CLE is set to the "H" level. The output signal is subsequently inverted by the inverter 52-1 and the normal column line CL0 is changed from the "L" level to the "H" level. Similarly, since the nodes Nd22 to Nd24 are set to the "H" level and the node Nd25 is not set to the "H" level, only the normal column lines CL0 to CL3 are used.

Figure 4:
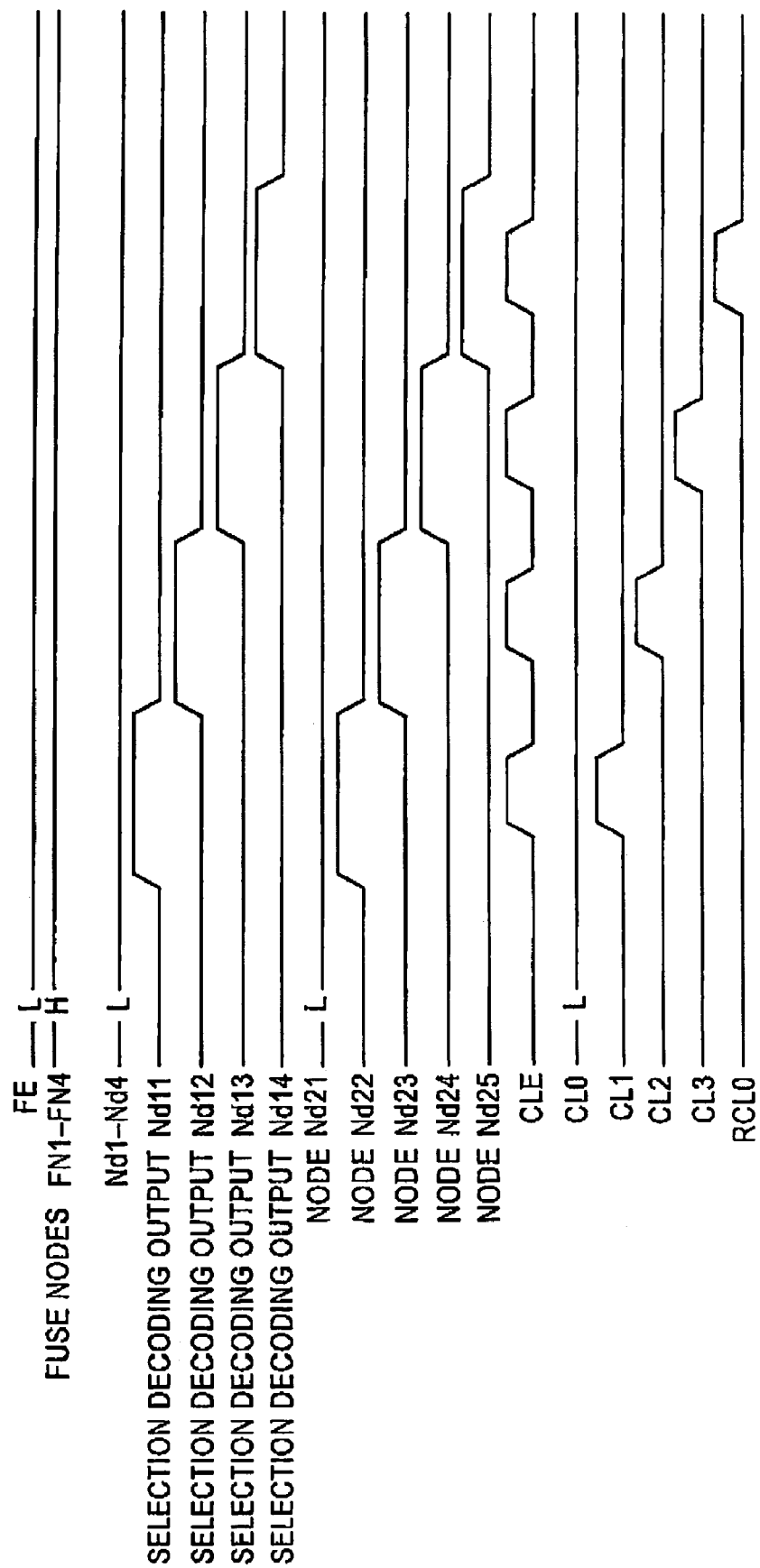
FIG. 4 is a timing waveform diagram showing the operation in a redundant cell test mode in the circuit proposed before.

(2) The Operation in the Redundant Cell Test Mode in the Circuit Proposed Before: FIG. 4

FIG. 4 is a timing waveform diagram showing the operation in the redundant cell test mode in the circuit proposed before.

The operation in the case of testing the redundant memory cell is as follows.

Since the fuse enable signal FE is at the "L" level, the fuse nodes FN1 to FN4 are set to the "H" level by the fuse driver 22 and a latch circuit comprising the PMOS 23a and the inverter 23c and PMOS 23b which receive an output of the PMOS 23a in the fuse clamp 23 and inverted by the inverters 24-1 to 24-4. The output nodes Nd1 to Nd4 are set to the "L" level. Among the transfer gates 42-1 to 42-8 in the column decoding switching circuit 40, thus, the transfer gates 42-2, 42-4, 42-6, and 42-8 are turned on and one of the nodes Nd22, Nd23, Nd24, and Nd25 is set to the "H" level, so that the normal column line CL0 is not used but the normal column lines CL1, CL2, and CL3 and the redundant column line RCL0 are used.

In the case of a general DRAM or the like in which an arbitrary address can be designated, by designating such an address that the selection decoding output node Nd14 is set to the "H" level, only the redundant column line RCL0 can be selected. In the semiconductor memory device such as an FIFO memory as shown in FIG. 1 in which the address setting cannot be performed and only the serial access is performed, however, since an arbitrary address cannot be designated, the selection decoding output nodes Nd11 to Nd14 are sequentially selected. It is necessary to access not only the redundant column line RCL0 but also the normal column lines CL1 to CL3. In the circuit proposed before, therefore, since the whole memory space is accessed only for discrimination of a defect of the redundant memory cell as described in "SUMMARY OF THE INVENTION" mentioned above, a testing time increases.

In the circuit of the embodiment 1, therefore, as shown in FIG. 2, the 2-input NANDs 31-1P to 31-4P in the column decoding circuit 30 are changed to the 3-input NANDs 31-1 to 31-4, that is, they are changed from two inputs of the column address $AY_{ij}$ to three inputs added with the redundant address signal Ab, and the following components are added: an inverter 32-5 which uses the redundant address signal Ab as an input and uses the node Nd15 that is supplied to the column decoding switching circuit 40 as an output; the inverter 41-5 which uses the redundant cell test mode signal C as an input; and the transfer gate 42-9 for switching the connection of the output node Nd15 of the inverter 32-5 by the redundant cell test mode signal C and an output node of the inverter 41-5.

By using the construction as mentioned above, in the embodiment 1, the following testing operation is executed.

Figure 5:
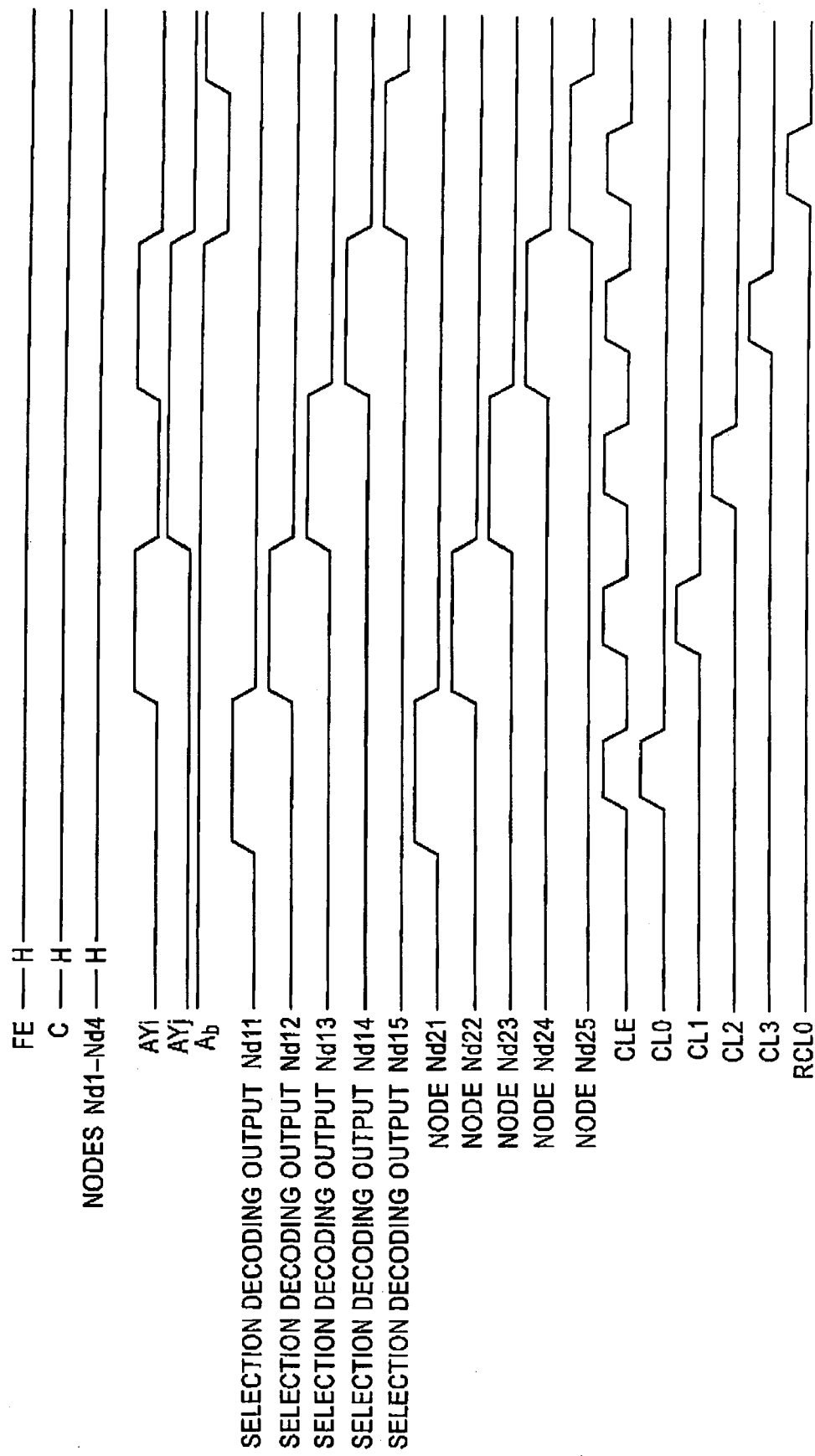
FIG. 5 is a timing waveform diagram showing the operation (redundant cell test mode) of FIG. 1 in the embodiment 1 of the invention.

FIG. 5 is a timing waveform diagram showing the operation (redundant cell test mode) of FIG. 1 in the embodiment 1.

The fuse enable signal FE, the redundant cell test mode signal C, and the redundant address signal Ab are set to the "H" level, the output side of the fuse driver 22 is set to the "L" level by the "H" level of the fuse enable signal FE, and the PMOS 23a is turned off. The fuse nodes FN1 to FN4 are, thus, set to the "L" level and inverted by the inverters 24-1 to 24-4 and the output nodes Nd1 to Nd4 are set to the "H" level. The "H" level of the output nodes Nd1 to Nd4 is inverted by the inverters 41-1 to 41-4. Among the transfer gates 42-1 to 42-8 in the column decoding switching circuit 40, the transfer gates 42-1, 42-3, 42-5, and 42-7 are turned on. Since the NANDs 31-1 to 31-4 have been activated by the "H" level of the redundant address signal Ab, the column address $AY_{ij}$ is decoded by the NANDs 31-1 to 31-4 and inverted by the inverters 32-1 to 32-4. For example, when the output node Nd11 of the inverter 32-1 is selected, the normal column line CL0 is used through the transfer gate 42-1, the NAND 51-1 which is activated synchronously with the column enable signal CLE, and the inverter 52-1. In a manner similar to the above, when the output nodes Nd12, Nd13, and Nd14 are selected, the normal column lines CL1, CL2, and CL3 are used, respectively. Since the redundant cell test mode signal C is at the "H" level, it is inverted by the inverter 41-5, the transfer gate 42-9 is turned on, and the output node Nd15 of the inverter 32-5 and the node Nd25 are always connected.

Since the semiconductor memory device of FIG. 2 according to the embodiment 1 relates to the serial access memory such as an FIFO memory, the normal column lines CL0 to CL3 are sequentially selected as shown in FIG. 5. By setting the redundant address signal Ab to the "L" level after the selection of the normal column line CL3, the output sides of the NANDs 31-1 to 31-4 are set to the "H" level and inverted by the inverters 32-1 to 32-4. The output nodes Nd11 to Nd14 are set to the "L" level, the "L" level of the redundant address signal Ab is inverted by the inverters 32-5, its output node Nd15 is set to the "H" level, and the redundant column line RCL0 is selected through the transfer gate 42-9, the NAND 51-5, and the inverter 52-5.

According to the embodiment 1, at the time of the defect test of the normal memory cell, the redundant memory cell can be continuously accessed after the access to the normal memory cell. As shown in the circuit which has been proposed before, thus, since there is no need to separately execute the redundant cell test and to access the unnecessary memory cell, the testing time can be reduced.

Figure 6:
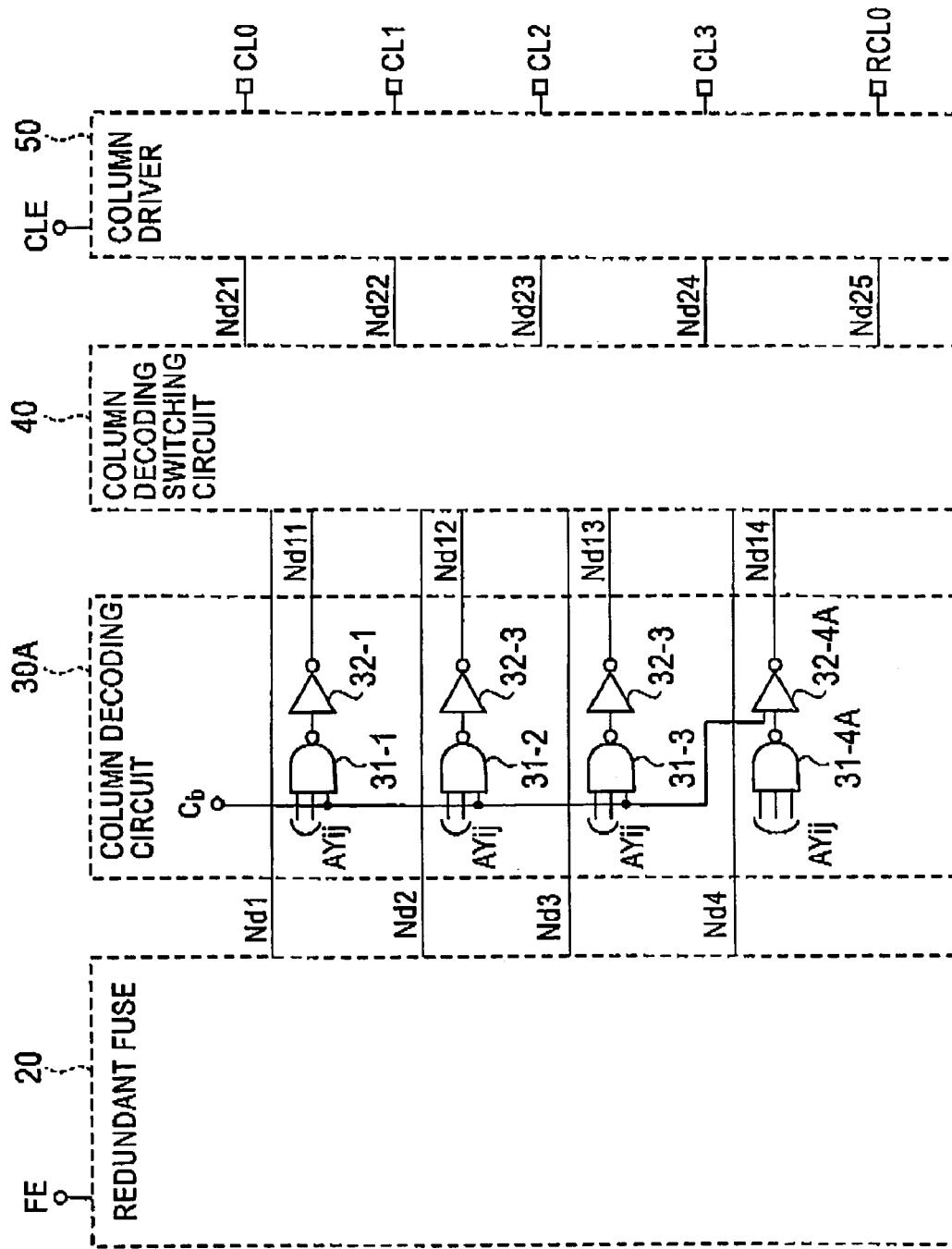
FIG. 6 is a schematic circuit diagram of a decoder in a column decoder in a semiconductor memory device showing an embodiment 2 of the invention.

FIG. 6 is a schematic circuit diagram of a decoder in a column decoder in a semiconductor memory device showing an embodiment 2 of the invention. FIG. 7 is a constructional diagram showing the whole circuit of FIG. 6.

In the decoder in FIG. 6, a column decoding circuit 30A having a construction different from that of the circuit 30 is provided in place of the column decoding circuit 30 in FIG. 2. In the column decoding circuit 30A, an inversion redundant cell test signal Cb is used in place of the redundant address signal Ab in FIG. 2, the redundant cell test signal C, the inverters 32-5 and 41-5, and the transfer gate 42-9 in FIG. 2 are omitted, and a second decoding portion (for example, 2-input NANDs 31-4A and 32-4A) is provided in place of the 3-input NANDs 31-4 and 32-4. The 2-input NAND 31-4A uses column address $AY_{ij}$ as an input. Its output signal and the inversion redundant cell test signal Cb are supplied to the 2-input NAND 32-4A and an output side of the NAND 32-4A corresponds to the node Nd14. The first transfer portion is constructed by the NANDs 31-1 to 31-3 and the inverters 32-1 to 32-3. Other constructions are similar to those in FIG. 2.

Further, although the decoder of FIG. 6 is generally used as a plurality of blocks (an example of three blocks is shown in FIG. 7) as shown in FIG. 6, the inversion redundant cell test signal of each block is replaced by other signals Cb1 to Cb3. Redundant column lines of the respective blocks are shown by RCL0, RCL1, and RCL2, respectively.

Figure 8:
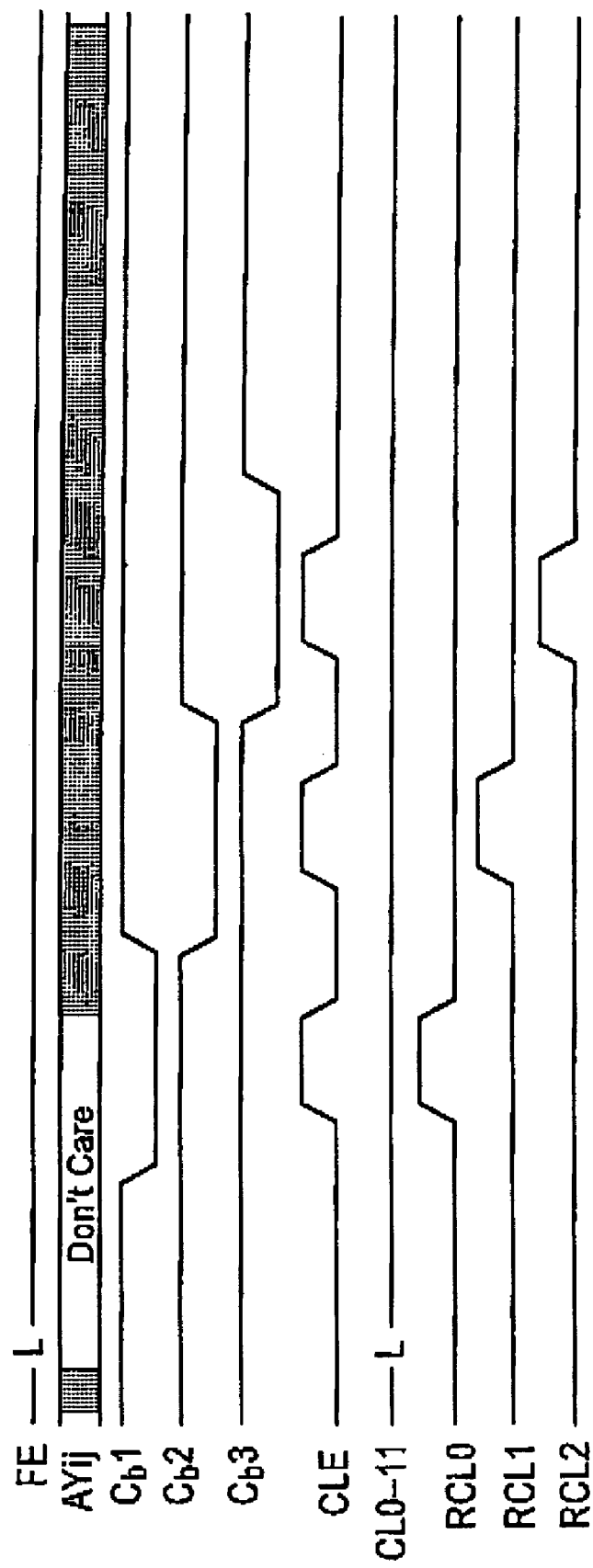
FIG. 8 is a timing waveform diagram showing the operation (redundant cell test mode) of FIG. 7 in the embodiment 2 of the invention.

FIG. 8 is a timing waveform diagram showing the operation (redundant cell test mode) of FIG. 7 in the embodiment 2.

According to the testing operation in the embodiment 2, in a manner similar to the operation of the circuit which has been proposed before, since the fuse enable signal FE is at the "L" level, the output nodes Nd1 to Nd4 from the redundant fuse 20 are set to the "L" level. Among the transfer gates 42-1 to 42-8 in the column decoding switching circuit 40, thus, the transfer gates 42-2, 42-4, 42-6, and 42-8 are turned on. In this state, by setting the inversion redundant cell test signal Cb1 to the "L" level, output sides of the NANDs 31-1 to 31-3 and 32-4A in the column decoding circuit 30A are set to the "H" level, the output nodes Nd11, Nd12, and Nd13 are set to the "L" level, and the output node Nd14 is set to the "H" level. When the output nodes Nd21 to Nd24 of the column decoding switching circuit 40 are set to the "L" level, the output node Nd25 is set to the "H" level, and the column enable signal CLE is set to the "H" level, therefore, the redundant column line RCL0 is selected. In a manner similar to the above, by sequentially setting the inversion redundant cell test signals Cb2 and Cb3 to the "L" level, only the redundant column lines RCL1 and RCL2 of the respective blocks are sequentially selected.

According to the embodiment 2, even in the case where the addresses can be serially operated, only the redundant memory cells can be sequentially accessed irrespective of the status of the column address $AY_{ij}$. At the time of the redundant cell test, therefore, since there is no need to access the unnecessary memory cell, the testing time can be reduced. Since the number of devices constructing the circuit is smaller than that of the circuit shown in the embodiment 1, a layout area can be also reduced.

The invention is not limited to the foregoing embodiments 1 and 2 but various modifications are possible. For example, the following (a) and (b) can be given as an embodiment 3 as a modification.

(a) The redundant fuse 20, the column decoding circuit 30 and 30A, the column decoding switching circuit 40, and the column driver 50 can be also constructed by circuit elements other than those shown in the diagram.

(b) The decoder of the embodiment can be applied to a semiconductor memory device which has a construction other than that in FIG. 1 and in which the serial access can be performed.

This application is based on Japanese Patent Application No. 2004-259528 which is hereby incorporated by reference.

What is claimed is:

1. A decoder of a semiconductor memory device, comprising:
    a redundant fuse for generating a redundant fuse signal in which a redundant position has been programmed;
    a column decoding circuit having a decoding portion to which a redundant address signal that is set to a first electric potential upon selection of a normal column line and shifted to a second electric potential upon selection of a redundant column line that is continuously selected after the end of the selection of said normal column line is supplied and which is activated by said first electric potential, decodes a column address, generates a normal column line selection signal, after that, is inactivated by said second electric potential, and stops the generation of said normal column line selection signal and an output portion for continuously generating a redundant column line selection signal after the generation of said normal column line selection signal in response to the second electric potential of said redundant address signal;
    a column decoding switching circuit having a first transfer portion whose transfer destination is switched by said redundant fuse signal and which generates said normal column line selection signal to the switched transfer destination and a second transfer portion for controlling passage or shut-off of said redundant column line selection signal in response to a redundant cell test signal; and
    a column driver having a first driving device which is activated by a column enable signal, drives said normal column line selection signal generated from said first transfer portion, and transmits the driven normal column line selection signal to said normal column line and a second driving device which is activated by said column enable signal, continuously drives said redundant column line selection signal generated from said second transfer portion after the generation of said signal from said first driving device, and generates the driven redundant column line selection signal to said redundant column line.

2. A decoder according to claim 1, wherein said decoding portion and said driving devices are constructed by logic circuits and said transfer portion are constructed by transfer gates.

3. A decoder of a semiconductor memory device, comprising:
    a redundant fuse for generating a redundant fuse signal in which a redundant position has been programmed;
    a column decoding circuit having a first decoding portion to which a redundant cell test signal that is set to a first electric potential upon selection of a normal column line and shifted to a second electric potential upon selection of a redundant column line is supplied and which is activated by said first electric potential, decodes a column address, generates a first normal column line selection signal, is inactivated by said second electric potential, and stops the generation of said first normal column line selection signal and a second decoding portion for decoding said column address, is activated by the first electric potential of said redundant cell test signal on the basis of a decoding result, generates a second normal column line selection signal, is inactivated by the second electric potential of said redundant cell test signal, and generates a redundant column line selection signal;
    a column decoding switching circuit having a first transfer portion whose transfer destination is switched by said redundant fuse signal and which generates said first normal column line selection signal to the switched transfer destination and second transfer portion whose transfer destination is switched by said redundant fuse signal and which generates said second normal column line selection signal generated from said second decoding portion or said redundant column line selection signal to the switched transfer destination; and a column driver having a first driving device which is activated by a column enable signal, drives said first and second normal column line selection signals generated from said first and second transfer portions, and generates the driven first and second normal column line selection signals to said normal column line and second driving device which is activated by said column enable signal, drives said redundant column line selection signal generated from said second transfer portions and generates the driven redundant column line selection signal to said redundant column line.

4. A decoder according to claim 2, wherein said decoding portion and said driving devices are constructed by logic circuits and said transfer portion are constructed by transfer gates.

* * * * *